United States Patent [19]
Mizoguchi et al.

[11] Patent Number: 6,028,327
[45] Date of Patent: Feb. 22, 2000

[54] LIGHT-EMITTING DEVICE USING AN ORGANIC THIN-FILM ELECTROLUMINESCENT LIGHT-EMITTING ELEMENT

[75] Inventors: Katsuhiro Mizoguchi; Taizou Tanaka, both of Tokyo, Japan

[73] Assignee: NEC Corporation, Tokyo, Japan

[21] Appl. No.: 08/974,346

[22] Filed: Nov. 19, 1997

[30] Foreign Application Priority Data

Nov. 19, 1996 [JP] Japan ................................ 8-307953

[51] Int. Cl.⁷ ..................................................... H01L 33/00
[52] U.S. Cl. ............................. 257/98; 257/99; 257/103; 313/504; 313/506
[58] Field of Search ............................... 257/98, 99, 103, 257/10, 40; 313/503, 504, 506

[56] References Cited

U.S. PATENT DOCUMENTS 5,807,627  9/1998  Friend et al. ............................ 257/103

FOREIGN PATENT DOCUMENTS 59-217991  12/1984  Japan .

*Primary Examiner*—Minh Loan Tran
*Attorney, Agent, or Firm*—Sughrue, Mion, Zinn, Macpeak & Seas, PLLC

[57] ABSTRACT

A light-emitting device using an organic EL element can be used in equipment demanding a small-scale and light-weight configuration. The light-emitting device includes an organic electroluminescent light-emitting element, a secondary battery such as a lithium battery and a shared cathode layer, which functions both as a cathode layer of the organic electroluminescent light-emitting element and as at least one cathode activator layer of the secondary battery. The organic electroluminescent light-emitting element and the secondary battery are provided in a single body manner via the shared cathode layer. The shared cathode layer comprises, for example, a metal having a work function of no greater than 4.3 eV.

12 Claims, 7 Drawing Sheets

LIGHT-EMITTING DEVICE USING AN ORGANIC THIN-FILM ELECTROLUMINESCENT LIGHT-EMITTING ELEMENT

BACKGROUND OF THE INVENTION

1. Field of the Invention

The present invention relates to an organic electroluminescent light-emitting element (hereinafter "organic EL element") and more particularly to a light-emitting device using an organic EL element.

2. Description of the Prior Art

A thin-film organic electroluminescent element (thin-film organic EL element) uses light emitted when organic molecules, which have been excited by the recombination of holes (positive vacancies) and electrons, shift to the ground state. Such an organic EL element is sometimes referred to as an "organic field light-emitting diode" or an "organic field LED (light emission diode)".

As FIG. 1 shows, a conventional organic EL element 100 comprises a transparent anode layer 102 which is provided on a transparent substrate 101, a hole injection/carrying layer 103 and an electron transportation and light-emitting layer 104 which are provided sequentially on the transparent anode layer 102. Further, a cathode layer 105 is provided on the electron transportation and light-emitting layer 104. Electric power must be supplied to the organic EL element 100 for emission of light so that the transparent anode layer 102 is positive and the cathode layer 105 is negative. A power source must therefore be provided. Ordinarily, as FIG. 1 shows, batteries 106 or the like are separately provided outside the organic EL element 100 in order to supply power to the organic EL element 100. The batteries 106 may comprise either primary or secondary batteries.

However, as shown in FIG. 1, in a conventional light-emitting apparatus using the above organic EL element, the primary or secondary batteries or the like which constitute the power source must be provided separately. This requires extra space, and is an obstacle to achieving light-weight and small-scale terminal equipment. Furthermore, wiring and connections are needed to provide the batteries separate from the organic EL element, thereby increasing the cost of materials, parts and assembling. Moreover, the electrical resistance of these wires and connections is far from negligible, and accelerates the exhaustion of the batteries.

Japanese Patent Laid-Open No. Sho 59-217991 (JP, A, 59-217991) discloses a light-emitting device wherein a light-emitting element utilizing electroluminescence of inorganic material and a solar cell, which functions as a power source for the light-emitting element, are provided in a multilayered arrangement, and the solar cell is disposed in a single unit manner with an emitting portion. FIGS. 2 and 3 show the light-emitting device disclosed in JP, A, 59-217991. The light-emitting device uses an element comprising an emitting portion 137 and a solar cell 141 which are multilayered in this order in a single unit on a glass substrate 131. The emitting portion 137 comprises an EL emitting layer 134 sandwiched between a pair of dielectric layers 133 and 135. In addition, transparent electrodes 132 and 136 are provided to the outer side of each of the dielectric layers 133 and 135 respectively. The solar cell 141 has a pin-type configuration comprising an n-type amorphous Si (silicon) layer 138, an i-type amorphous Si layer 139 and a p-type amorphous Si layer 140. A metallic electrode 142 is provided on the p-Si layer 140. The transparent electrode 136 of the emitting portion 137 also functions as an electrode for the n-Si layer 138. Here, a thin film, comprising ZnS (zinc sulfide) mixed with a minute quantity of activator substance, is used as the EL emitting layer 134.

However, since the light-emitting device utilizing the element shown in FIG. 2 emits light by means of inorganic electroluminescence, a comparatively high ac (alternating current) voltage must be applied to the EL emitting layer 134. Consequently, as FIG. 3 shows, the light-emitting device further comprises a battery 144 for storing power generated by the solar cell 141, an oscillating/boosting portion 145 for generating alternating current to be applied to the EL emitting layer 134, a sensor 146 for determining daytime or night-time, and a controller 143 for executing control so that, during daytime, power generated by the solar cell 141 is stored in the battery 144 and, during night-time, power from the battery 144 is supplied to the EL emitting layer 134 by means of the oscillating/boosting portion 145.

Since the conventional light-emitting device disclosed in JP, A, 59-217991 (FIGS. 2 and 3) requires, in addition to a solar cell 141 provided in a single unit with the EL emitting layer 134, a controller 143, a secondary battery 144, an oscillating/boosting portion 145 and a sensor 146, the apparatus is expensive and cannot easily be assembled to small-scale or light-weight. Since electrical energy generated by the solar cell 141 has to be stored in the battery 144 during bright daytime hours, the emission cannot easily be maintained for long periods during daytime. But even when the apparatus is used primarily to emit light at night, the disadvantage remains that, unless the apparatus is positioned in a location which is bright during daytime, the electrical energy required to emit light cannot be stored. A further inconvenience is that, since the only power source is provided by energy generated by a solar cell, there is a limit on the period of time over which the apparatus can be continuously run. The solar cell 141 does not function without injection of light energy. However, in the conventional device, since the emitting portion 137 is disposed at the front of solar cell 141, the emitting portion 137 reflects, disperses and consumes the light intended for the solar cell 141, thereby reducing the amount of light injected to the solar cell 141 and notably damaging the efficiency of the solar cell 141 to generate power. This has the disadvantage that the solar cell 141 does not provide a sufficient power source.

The fundamental reason for the various problems of the conventional light-emitting device shown in FIGS. 2 and 3 is that the voltage source secured in a single unit manner to the emitting portion is a solar cell. In principle, a solar cell is an element which converts light into electric energy, and therefore does not function without light. Furthermore, although a solar cell may be capable of solar-electric power generation, it has no ability to store electrical energy and consequently requires a battery and the function as a power source is obtained only by combining the solar cell and the battery. Moreover, since this power source is obtained by means of light energy conversion, a light sensor and a controller thereof are also required. Such a complicated configuration makes this conventional light-emitting device extremely unsuitable for small-scale or light-weight manufacture, such as for portable equipment and the like.

Furthermore, the light-emitting device disclosed in JP, A, 59-217991 comprises a common electrode which functions as one electrode of the emitting portion 137 and as the electrode of the n-Si layer side of the solar cell 141. However, since light must be injected to the solar cell, the electrode used is restricted to a transparent electrode such as the transparent electrode 136 shown in FIG. 2. This transparent electrode must comprise electrode material having high electric conductivity. Furthermore, since emitting portion 137 is an inorganic EL element using electroluminescence of inorganic material as explained above, the emission principle of this emitting portion 137 is essentially different from the emission principle of an organic EL element. In other words, in the inorganic EL element, a light-emitting layer is sandwiched between a pair of dielectric layers, electrons are accelerated and collide by means of a large electric field applied from the electrodes via each dielectric layer to the luminescence center of the light-emitting layer, and electroluminescence thereby generated is used. The inorganic EL element therefore requires a large electric field. Further, the inorganic EL element is ordinarily driven by an ac power.

By contrast, as described above, the organic EL element uses light emitted by the energy difference created when organic molecules, which have been excited by the recombination of a hole and an electron, shift to the ground state. Therefore, the organic EL element is able to emit light with a low-voltage direct current. Emission using electroluminescence differs completely in principle between an inorganic EL element and an organic EL element.

In a conventional light-emitting device using an organic EL element, batteries or the like must be provided separately, hindering small-scale and light-weight manufacture of the apparatus. In addition, the electrical resistance of connection wires and the like accelerates exhaustion of the batteries. Furthermore, in a conventional light-emitting device wherein an inorganic EL element is multilayered in a single body manner to the solar cell, a battery and an oscillating/boosting portion are additionally required. Moreover, the inorganic EL element weakens the light injected to the solar cell, noticeably damaging the power generation efficiency.

If an organic EL element is provided in a multilayered arrangement with a solar cell or a chemical battery, the electrodes of the organic EL device must be not only conductive but must also be efficient emitters of electrons and positive holes. In such an arrangement the battery electrode and the organic EL element cannot easily be formed from the same material.

SUMMARY OF THE INVENTION

The object of the present invention is to provide a new type of light-emitting device using an organic EL element, and more particularly to provide a light-emitting device for use in equipment demanding a small-scale and light-weight configuration, such as portable terminal equipment and the like.

Another object of the present invention is to provide a light-emitting device which can improve properties, performance and productivity of equipment using the light-emitting device, can reduce size and weight of the apparatus with highly integrated parts, and can simplify configurations of circuits of the equipment.

In order to achieve the above objectives, the light-emitting device of the present invention comprises: an organic electroluminescent light-emitting element; a battery; and a shared cathode layer, which functions both as a cathode layer of the organic electroluminescent light-emitting element and as at least one cathode activator layer of the battery; wherein the organic electroluminescent light-emitting element and the battery are provided in a single body via the shared cathode layer.

In other words, the light-emitting device of the present invention comprises a shared cathode layer, which functions both as a cathode layer for electron emission in the organic EL element and as at least one cathode activator layer of the battery. Consequently, an organic EL element and the secondary battery, which constitutes the power source for the organic EL element, are arranged in a multilayered configuration, functioning both as the power source and the light-emitting portion and thereby realizing a new type of light-emitting device.

Metals having a work function of no greater than 4.3 eV should preferably be used as the shared cathode layer. More specifically, at least one type of metal selected form the following can be used: alkali metals, alkaline earth metals, aluminium (Al), zinc (Zn), silver (Ag), lead (Pb), scandium (Sc), indium (In), samarium (Sm), yttrium (Y). Moreover, an alloy containing at least one of the above metals, or a compound containing at least one of the above metals or the like can be used.

In order to increase the drive voltage applied to the organic EL element, the battery can comprise a plurality of unit cells provided in series in a stacked arrangement. The organic EL element can emit light by electrically connecting a first anode terminal, extracted from an anode activator layer of the uppermost unit cell, to a second anode terminal, extracted from the transparent anode layer. By stacking the unit cells in series in this manner, in comparison with the electromotive force provided by a single unit cell, an electromotive force increased exactly in accordance with the number of stacked unit cells can now be applied to the organic EL element.

Furthermore, in order to increase the drive current applied to the organic EL element, the secondary battery may comprise 2n unit cells, where n denotes an integer not less than 1. Then, n unit cells of the batteries are multilayered to form a first stack, and the remaining n unit cells are multilayered to form a second stack. The anode activators of the uppermost unit cells within each of the first and second stacks together constitute a shared anode layer. Furthermore, the cathode activator of the lowermost unit cell within the first stack is the shared cathode layer, which is electrically connected to a cathode activator layer of a lowermost unit cell within the second stack. The organic EL element can emit light by electrically connecting a first anode terminal, extracted from an anode activator layer of an uppermost unit cell, to a second anode terminal, extracted from the transparent anode layer. Here, where two parallel rows are provided as explained, but where the number of multilayered stacks to be electrically connected in parallel is increased, a current increased in accordance with the increase in the number of parallel multilayered stacks can be applied to the organic EL element.

When these unit cells or multilayered stacks are arranged in series or in parallel, a switch is further provided in order to emit light or to recharge the battery. In a first position, the switch connects the first anode terminal to the second anode terminal, and, in a second position, the switch connects a positive electrode of an external power source to the first anode terminal. The negative electrode of the external power source can be electrically connected to the shared cathode layer. A "unit cell" here refers to a unit simple battery in an electrochemical sense, in which an electrolytic layer is provided between one cathode activator layer and one anode activator layer. Furthermore, "uppermost unit cell" and "lowermost unit cell" refer respectively to the unit cells that are uppermost and lowermost when viewed potentially.

The principle of light-emitting of an organic EL element is that photo-energy known as electroluminescence (EL) is emitted when organic molecules, which have been excited by the recombination of holes and electrons, shift from the excitation state to the ground state. More specifically, a hole injection/carrying layer, a electron carrying/light-emitting layer and a cathode layer are provided in a multilayered arrangement above a transparent anode layer. When an electrical field is applied between the cathode layer and the anode layer, the anode layer emits holes. These holes reach the interface with the electron carrying/light-emitting layer or the inside of the electron carrying/light-emitting layer via the hole injection/carrying layer. Also, the cathode layer emits electrons which reach the inside of the electron carrying/light-emitting layer. As a result, the electrons are recombined with the holes inside the electron carrying/light-emitting layer, thereby exciting the organic molecules. When the excited organic molecules consequently shift from the excitation state to the ground state, light having a color corresponding to the energy gap between the two states is generated. The light generated in the electron carrying/light-emitting layer passes through the hole injection/carrying layer and is radiated outside.

The most important factor for increasing the light-emitting efficiency of such an organic EL element is to release the carriers such as the holes and electrons from each electrode under a low electrical field, and to effectively inject these carriers into the hole injection/carrying layer and the electron carrying/light-emitting layer. As cathode materials capable of easily emitting electrons, it is most important that metals having low work function, such as alkali metals, alkaline earth metals, lathanoids, actinoids, or alloys of these, are used.

As the cathode activator material for the secondary battery, most effective is a metal which is electrochemically base, in other words, which has high reduction strength and a high ionization tendency. For instance, alkali metals, alkaline earth metals, aluminium (Al), zinc (Zn), lead (Pb), cadmium (Cd), indium (In) and the like, or alloys of these, are often used.

Based on these points, the present applicants have discovered that it is possible to select metals or their alloys that possess both the electron-emitting capability required for the cathode material of an organic EL element and the cathode activator capability required for the secondary battery. By providing a shared cathode layer capable of both these functions, the present applicants have achieved a new type of organic EL element, in which the power source is housed internally, and a manufacturing method thereof.

For instance, a lithium battery, whose primary component is lithium (Li) metal or the like, or lithium ion battery is suitable as a practical cathode activator material for the battery. Furthermore, lithium or an alloy thereof, having a low work function, are widely available as suitable cathode material for the organic EL element. From this example alone, it can be easily understood that it is possible in practice to select a cathode material offering the functions of the cathode activator for the battery and the electron emission for the organic EL element. Furthermore, by using a cathode material which provides both these functions, it is possible to understand the multilayered configuration of an organic EL element wherein the power source is internally stored.

By illustrating the differences between the light-emitting device of the present invention and a conventional light-emitting device, in which an inorganic EL element and a solar cell are provided in a multilayered arrangement, it can be demonstrated that, with the shared electrode hitherto used in conventional light-emitting devices, the shared cathode layer of the present invention cannot be realized. In the case of a conventional light-emitting device comprising an inorganic EL element and a solar cell, it was possible to choose a given conductor provided that it was transparent, but the present invention uses a chemical battery, thereby limiting the type of materials which can be used as the electrodes. Furthermore, an organic EL element necessarily requires high electron emission. Therefore, in the present invention, the importance of the material used for the electrodes is noticeably higher, and it is no longer possible to use arbitrarily given material.

DESCRIPTION OF THE PREFERRED EMBODIMENTS

First Embodiment

Figure 1:
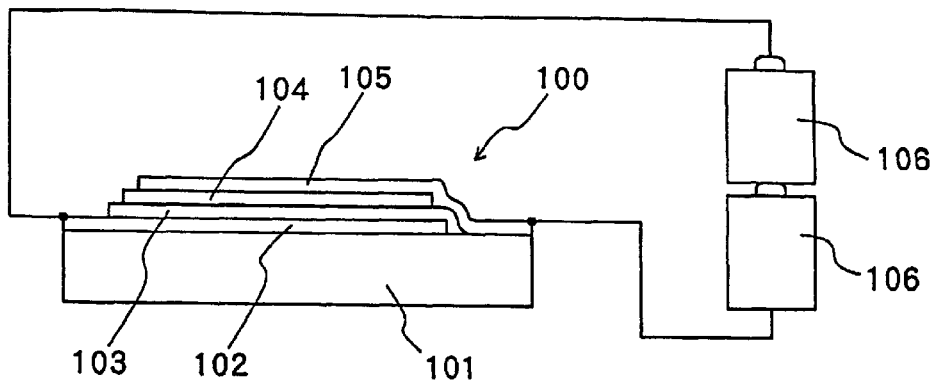
FIG. 1 is a cross-sectional view showing the primary parts of a conventional light-emitting device having an organic EL element and a secondary battery.
Figure 2:
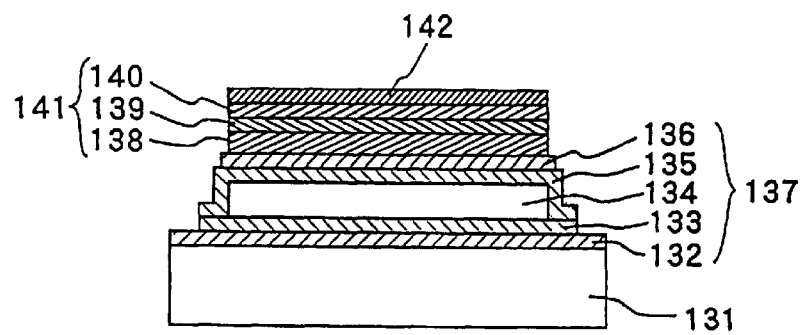
FIG. 2 is a cross-sectional view showing a conventional light-emitting device having an inorganic EL element and a solar cell provided in a multilayered arrangement.
Figure 3:
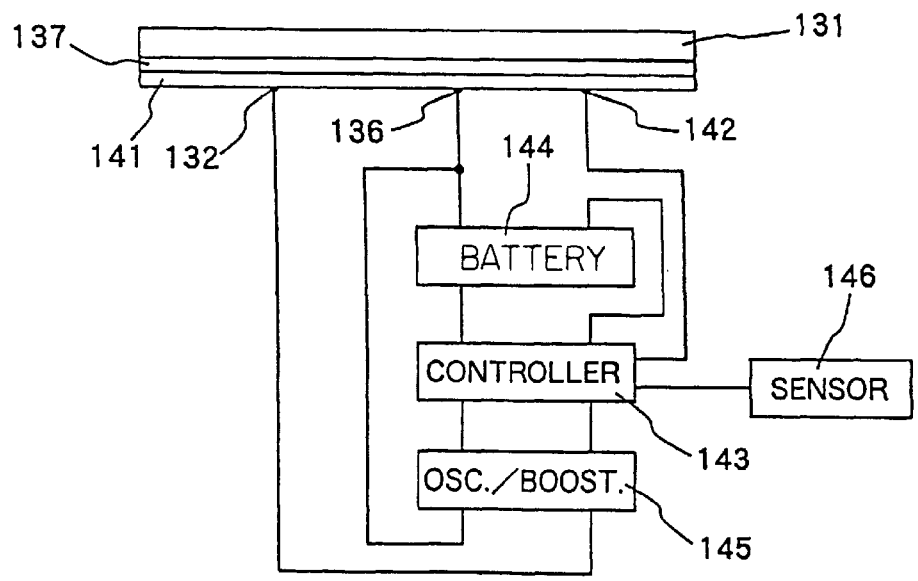
FIG. 3 is a block diagram showing the circuit configuration for operating the light-emitting device of FIG. 2.
Figure 4:
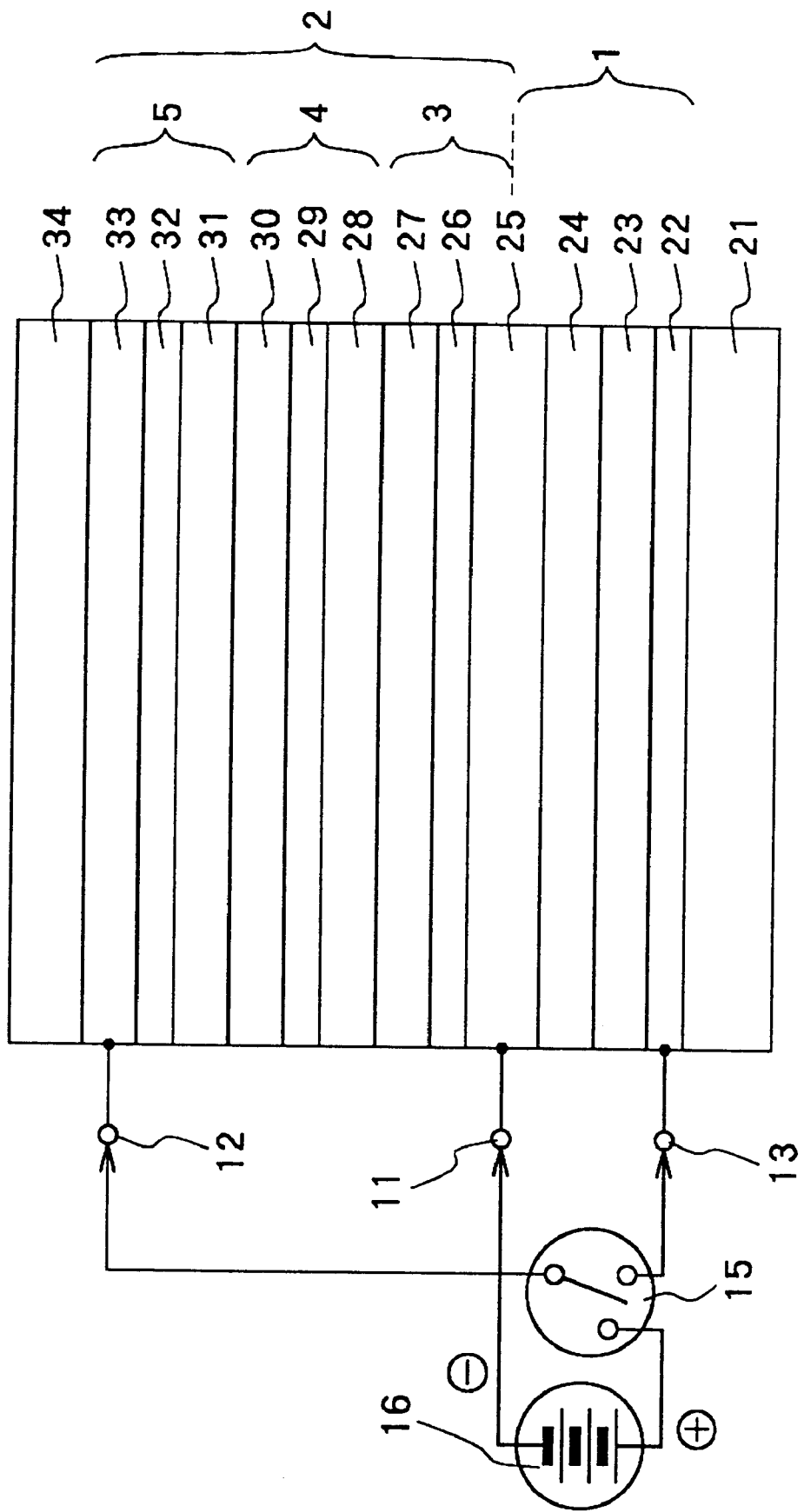
FIG. 4 is schematic cross-sectional view showing a light-emitting device according to a first embodiment of the present invention.

The light-emitting device shown in FIG. 4 according to the first embodiment comprises an organic EL element 1 and a battery portion 2 which are provided in a multilayered arrangement above a transparent insulator substrate 21 for extracting light to the outside, and second substrate 34 disposed thereon. The transparent insulator substrate 21 constitutes a first substrate. The secondary battery portion 2 comprises three unit cells 3 to 5 which are provided in series in a multilayered arrangement. A plate or film of any type of glass or plastic material can be used as the transparent insulator substrate 21. Here, the cathode layer of the organic EL element portion 1 and the cathode activator layer of the first cell 3 comprise identical material. Moreover, both are formed in a single unit, and both share a shared cathode layer 25. In other words, the configuration is a multilayered one comprising the multilayered structure of the elements of the organic EL element portion 1 in the lower part of the diagram, and the multilayered structure of the elements of the battery portion 2 in the upper part of the diagram, with the shared cathode layer 25 in the center.

In this embodiment, a unit cell comprises a cathode activator layer, an electrolytic layer and an anode activator layer. Three such unit cells are arranged in series, making it possible to extract three times the voltage obtained with a single unit cell and this voltage can be applied to the organic EL element portion 1. Thus, by providing the unit cells in series in a multilayered arrangement, the extractable voltage can be set arbitrarily in compliance with the number of layers. In addition, the voltage applied to the organic EL element portion 1 can be arbitrarily adjusted.

The organic EL element portion 1 comprises a transparent anode layer 22, a hole injection/carrying layer 23, an electron carrying/light-emitting layer 24, and a shared cathode layer 25 also functioning as a secondary battery portion 2. These layers are provided above the transparent insulator substrate 21 in a multilayered arrangement in the above sequence. Holes emitted from the transparent anode layer 22 are injected into the hole injection/carrying layer 23 and carried thereby. The shared cathode layer 25 emits electrons to the electron carrying/light-emitting layer 24. The materials from which the organic EL element portion 1 is comprised will next be explained in detail.

A transparent p-type conductive film comprising a metal oxide or the like such as indium (In) or tin (Sn) can preferably be used for the transparent anode layer 22. A thin-film material having high hole injection and high hole mobility, selected from any type of organic amine compound or the like, can be used for the hole injection/carrying layer 23. In this case, a material comprising a combination of substances may acceptably be used.

A thin-film material selected from n-type organic compounds having high electron mobility and high EL light-emitting efficiency of electroluminescence generated by the recombination of holes and electrons may, for instance, be used as material for the electron carrying/light-emitting layer 24. Here, unified thin-film material such as alminoquinolium complex or the like, or thin-film material or the like in which quinacridone or the like has been added to alminoquinolium complex as a dopant for improving the emission efficiency can be used. A thin-film material comprising a combination of an electron-carrying material and an EL light-emitting material is also acceptable.

Considering the requirements of an organic EL element cathode layer, a metal which easily emits electrons under a low electrical field, or an alloy or metallic compound thereof, is effective as the shared cathode layer 25. Therefore, the substance used for the shared cathode layer 25 must have a relatively low work function. Research to date suggests that, in practice, a work function of not greater than 4.3 eV is required.

Here, it is important that the material of the shared cathode layer 25, which constitutes the basic component of the present invention, offers both the cathode activator function of a battery and the electron emission function of an organic EL element. In other words, the shared cathode layer 25 must act as a battery cathode activator and as an organic EL element cathode. Therefore, the physical properties required by the material of the shared cathode layer 25 are, firstly, that the material must have a low work function as an organic EL element; more particularly, for practical purposes, the work function must be no greater than 4.3 eV. Alkali metals, alkaline earth metals, lathanoids and actinoids each have a work function no greater than 4.3 eV. In addition to these, the work function of indium is 4.09 eV, silver is 4.26 eV, zinc is 3.63 eV, aluminium is 4.28 eV, scandium is 3.5 eV, yttrium is 3.1 eV, lead is 4.25 eV. The above-mentioned metal elements are effective for providing the function of an organic EL element for the shared cathode layer 25. Secondly, a metal element which is electrochemically base, in other words, which has high reduction strength, and in addition has a high ionization tendency and a high electromotive force, is effective as the battery cathode activator. In practice, metal elements such as alkali metals, alkaline earth metals, aluminium, lead, zinc, silver, scandium, yttrium and the like are effective as the secondary battery cathode activator.

Considering the above points in conjunction, the most practically effective materials to be used as the shared cathode layer 25, jointly offering the functions of electron emission of an organic EL element and cathode activator of a battery, are metals such as alkali metals, alkaline earth metals, aluminium, zinc, silver, lead, scandium, indium, samarium, yttrium, or alloys of these and other metals, and compounds containing the above metals.

As described above, battery portion 2 comprises three cells 3 to 5 provided in series in a stacked arrangement. In other words, the first cell 3 uses the shared cathode layer 25 as a cathode activator, above which are multilayered an electrolytic layer 26 and an anode activator layer 27. A cathode activator layer 28, an electrolytic layer 29 and an anode activator layer 30 of the second cell 4 are multilayered in this sequence above the anode activator layer 27 of the first cell 3. A cathode activator layer 31, an electrolytic layer 32 and an anode activator layer 33 of the third cell 5 are multilayered in this sequence above the anode activator layer 30 of the second cell 4. The anode activator layer 33 of the third cell 5 contacts with the second substrate 34. A cathode terminal 11 is extracted from the shared cathode layer 25, a first anode terminal 12 is extracted from the anode activator layer 33 of the third cell 5, and a second anode terminal 13 is extracted from the transparent anode layer 22 of the organic EL element portion 1.

Each of the electrolytic layers 26, 29 and 32 which are components of the battery must have a high ion mobility for ions of a metal element selected as a cathode activator, and must be capable of functioning as a separator for physically separating the cathode activators and the anode activators of the battery. For instance, as the electrolytic layer, wet material such as paper or unwoven cloth of glass fiber or polymer fiber, or the like, which has been impregnated with an electrolytic solution having high mobility with respect to ions of the metal of the cathode activator material, can be used. As another embodiment, no unwoven cloth or paper or the like is used, and a solid electrolyte having high mobility of ions of the metal selected as the cathode activator can be used. Since this electrolyte is solid, it can also provide the other function required of the electrolytic layer, namely that of a separator.

For each of the anode activator layers 27, 30 and 33, which are components of the battery, a conductive material with high oxidity and high electromotive power, caused by an electrochemical reaction with the cathode activator, is effective. Moreover, in order to facilitate repeated recharging and discharging of the battery, the anode activator layers must possess the function of anode activators capable of uniformly and stably maintaining all types of ions emitted as a result of the electrode reaction of the cathode activator by means of an anode reaction therewith. Therefore, the following materials are extremely effective as the anode activator layers: metal oxides such as $MnO_2$, $AgO$, $HgO$, $PbO_2$, $V_2O_5$ or the like; metal sulfides such as $TiS_2$, $MoS_2$; metal hydroxides such as $NiOOH$; carbon compounds such as graphite or fluorographite $((CF)n)$; as well as conductive polymers such as polyaniline, polypyrrole, polyacetylene, polythiophene, poly-p-phenylene or the like. The materials used for the anode activator and the electrolyte are basically determined in accordance with the type of cathode activator used in the battery. Thus the material of the cathode activator has important significance as regards the configuration of the battery. The provision of a cathode which shares the functions of cathode activator layer and organic EL element cathode, as in the present invention, is therefore highly effective.

The method of handling the light-emitting device will next be explained. A double-pole switch 15 and a recharger 16 are prepared. The first anode terminal 12 is connected to a common connection point of the switch 15, the second anode terminal 13 is connected to the first contact terminal of the switch 15, and the positive output terminal of the recharger 16 is connected to the second contact terminal of the switch 15. Then, the negative output terminal of the recharger 16 is connected to the cathode terminal 11. Then, by turning the switch 15 to the first contact side, in other words, by using the switch 15 to electrically connect the anode activator layer 33 of the third cell 5 to the transparent anode layer 22 of the organic EL element portion 1, the electromotive force from the battery portion 2 is applied to the organic EL element portion 1. As a consequence, the electron carrying/light-emitting layer 24 of the organic EL element portion 1 emits electroluminescent light which is supplied to the exterior via the transparent insulator substrate 21. When the switch 15 is disconnected, the supply of electrical power to the organic EL element portion 1 is interrupted, thereby halting emission.

Furthermore, when the organic EL element portion 1 has stopped emission due to exhaustion of the battery portion 2, the battery portion 2 must be recharged. Now, by turning the switch 15 to the second contact side, the positive output terminal of the recharger 16 is connected to the anode activator layer 33 of the third cell 5. The recharger 16 is thereby electrically connected between the shared cathode layer 25, which functions both as the cathode of the organic EL element portion 1 and as the cathode activator layer of the first cell 3, and the anode activator layer 33 of the third cell 5. As a result, the battery portion 2 is recharged by the recharger 16, replenishing the electrical power of the battery.

By repeating the operation described above, light emission using organic EL can be obtained continually over a long period.

Second Embodiment

In the first embodiment, unit cells were stacked in series to form a battery portion in order to increase voltage applied to the organic EL element. In the second embodiment of the light-emitting device shown in FIG. 5, intensity of light emitted is raised by increasing the current by means of a parallel connection of batteries.

Figure 5:
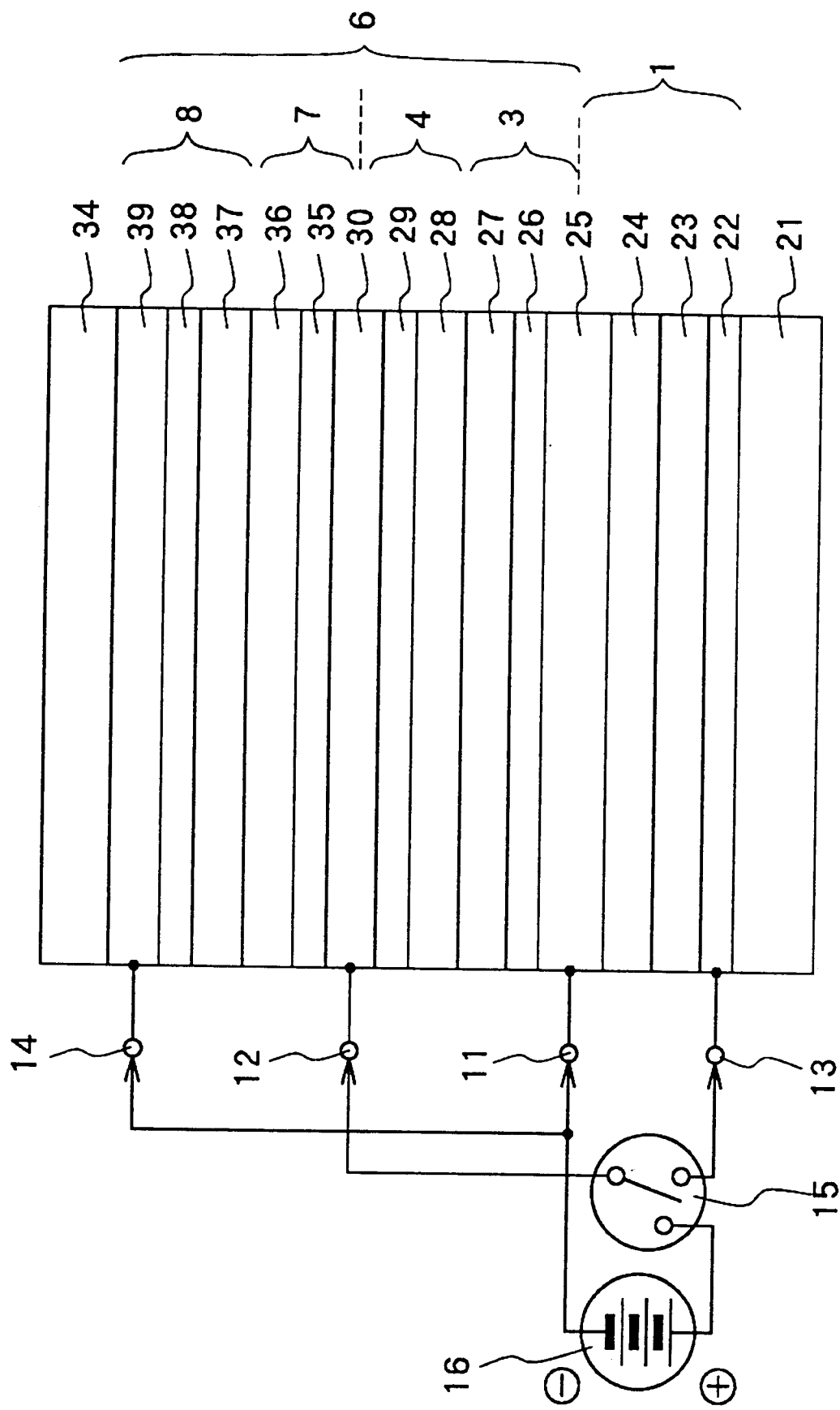
FIG. 5 is schematic cross-sectional view showing a light-emitting device according to a second embodiment of the present invention.

In the light-emitting device shown in FIG. 5, the battery portion 6 comprises a first cell 3 and a second cell 4 which are connected in series, and a third cell 7 and a fourth cell 8 which are connected in series, these two parts being electrically connected in parallel. Structurally, the organic EL element portion 1, the first cell 3, the second cell 4, the third cell 7 and the fourth cell 8 are provided in this sequence in a multilayered arrangement above the transparent insulator substrate 21. In addition, a second substrate 34 is provided thereon. Explained in detail, the configuration from the transparent insulator substrate 21 to the anode activator layer 30 of the second cell 4 is identical to the configuration of the light-emitting device according to the first embodiment shown in FIG. 4. However, in the second embodiment, the anode activator layer 30 of the second cell 4 is a shared anode layer which also functions as the anode activator layer of the third cell 7. Further, an electrolytic layer 35 and a cathode activator layer 36 of the third cell 7 are provided in a multilayered arrangement above the anode activator layer 30 which is jointly used by the second cell 4 and the third cell 7. Above the cathode activator layer 36 of the third cell 7, an anode activator layer 37, an electrolytic layer 38 and an cathode activator layer 39 of the fourth cell 8 are provided in this sequence in a multilayered arrangement.

A first cathode terminal 11 is derived from the shared cathode layer 25, a first anode terminal 12 is derived from the anode activator layer 30 for joint use by the second cell 4 and the third cell 7, a second anode terminal 13 is derived from the transparent anode layer 22 of the organic EL element portion 1, and a second cathode terminal 14 is derived from the cathode activator layer 39 of the fourth cell 8.

In this light-emitting device, the upper sides (as shown in FIG. 5) of the first cell 3 and the second cell 7 are anodes, the second cell 4 and the third cell 7 share the anode activator layer 30, and the lower sides (as shown in FIG. 5) of the third cell 7 and the fourth cell 8 are anodes. As FIG. 5 shows, since the first cathode terminal 11 and the second cathode terminal 14 are electrically connected, the cathode activator layer of the first cell 3, namely the shared cathode layer 25 is electrically connected to the cathode activator layer 39 of the fourth cell 8, thereby achieving the parallel connection described above. In other words, in the present light-emitting device, stacks each comprising two unit cells connected in series are provided above and below the central anode activator layer 30, which functions as a shared anode layer, and these two stacks are connected in parallel. Therefore, in this configuration, the current obtained is twice the value of the current obtained from a unit cell. This increased current can then be used to drive the organic EL element portion 1. In the above explanation the configuration contained two parallel rows, but it is possible to increase the number of rows. With n rows, light can be emitted using a current which is n times the value of the current obtained from a unit cell. This configuration is particularly effective in the case when insufficient light is emitted by the organic EL element due to a low current value per unit cell.

Next, the operation of the light-emitting device will be explained. It is presumed here that the first cathode terminal 11 and the second cathode terminal 14 have been connected to obtain the parallel connection described above.

As in the first embodiment, a switch 15 and a recharger 16 are prepared, the first anode terminal 12 is connected to the common connection point of the switch 15, the second anode terminal 13 is connected to the first contact terminal of the switch 15, and the positive electrode of the recharger 16 is connected to the second contact terminal of the switch 15. Then, the negative output terminal of the recharger 16 is connected to the first cathode terminal 11. Then, by turning the switch 15 to the first contact side, the electromotive force from the battery portion 6 is applied to the organic EL element portion 1. As a consequence, the electron carrying/ light-emitting layer 24 of the organic EL element portion 1 emits electroluminescent light which is supplied to the exterior via the transparent insulator substrate 21. When the switch 15 is disconnected, the supply of electrical power to the organic EL element portion 1 is interrupted, thereby halting emission.

Furthermore, when the organic EL element portion 1 has stopped emitting light due to exhaustion of the battery portion 6, the battery portion 6 must be recharged. Now, by turning the switch 15 to the second contact side, the positive output terminal of the recharger 16 is connected to the anode activator layer 30, namely the shared anode layer, whereby the recharger 16 is electrically connected between the shared cathode layer 25 and the anode activator layer 30. As a result, the battery portion 6 is recharged by the recharger 16, restoring the electromotive force of the battery portion 6.

When the parallel connection described in the second embodiment is realized, it becomes possible to extract a current with at least twice the value of the current from a single unit cell, further improving the light-emitting properties of the organic EL element portion 1. For instance, when a solid electrolyte is used, the current generated by the unit cells is lower than when a wet electrolyte is used. Therefore, the intensity of the light emitted by the organic EL element can be improved by using the configuration according to the second embodiment. Since the organic EL element utilizes electroluminescent emission due to recombination of holes and electrons, an increase in current increases the intensity of the light.

EXAMPLES

The present invention will next be explained in further detail based on examples.

Example 1

A light-emitting device was created based on the first embodiment shown in FIG. 4.

A glass plate having length 50 mm, breadth 100 mm and thickness 1 mm was used as the transparent insulator substrate 21, and a transparent anode layer 22 comprising ITO (Indium-Tin-Oxide) and approximately 100 nm thick was deposited onto the transparent insulator substrate 21 using a spattering process. After carefully cleaning the glass substrate on which the transparent anode layer 22 had been deposited, a hole injection/carrying layer 23 comprising N,N'-diphenylyl-N,N'-bis(a-naphthyl)-(1,1'-diphenyl)-4,4'-diamine (hereinafter αNPD) with a thickness of approximately 50 nm, a electron carrying/light-emitting layer 24 comprising a hydroxyquinolinol-aluminium complex (hereinafter Alq$_3$) and quinacridone (hereinafter Qd) with a thickness of approximately 70 nm, and a shared cathode layer 25 comprising an alloy of lithium (Li) and aluminium (Al) (composite ratio of Li:Al=1:1) with a thickness of not less than approximately 0.1 mm were deposited in this sequence by vacuum evaporation onto the transparent anode layer 22 inside a vacuum deposition chamber at a degree of vacuum of less than $4 \times 10^{-4}$ Pa. A metal mask was used for the patterning of each layer. Then the device was removed from the vacuum deposition chamber and was preserved inside a glove box in an atmosphere of Ar gas.

Next, inside the glove box, a hollow-body rectangular rubber packing 41 having external dimensions of length 50 mm, breadth 80 mm, width 5 mm and thickness 0.80 mm and internal dimensions of length 40 mm and breadth 70 mm was provided above the substrate upon which the shared cathode layer 25 had already been formed. Next, a pre-cut electrolyte sheet (thickness approximately 20 μm, length 40 mm, breadth 70 mm) corresponding to the electrolytic layer 26, an anode activator layer sheet (thickness approximately 0.1 mm, length 35 mm, breadth 65 mm) corresponding to the anode activator layer 27, and a copper foil (thickness approximately 20 μm, length 35 mm, breadth 85 mm) were provided in this sequence in a multilayered arrangement within the hollow body formed by the rubber packing 41, thereby forming the first cell 3 of the secondary battery portion 2. Then, a cathode activator layer sheet which consisted of a Li-Al alloy foil (thickness approximately 0.1 mm, length 35 mm, breadth 65 mm) corresponding to the cathode activator layer 28, a electrolyte sheet corresponding to the electrolytic layer 29, a anode activator layer sheet corresponding to the anode activator layer 30 and a second copper foil 42 were multilayered above the copper foil 42, thereby forming second cell 4. A third cell 5 comprising a cathode activator layer 31, an electrolytic layer 32 and an anode activator layer 33, was similarly formed. Finally, a copper foil 42 (thickness 20 μm, length 35 mm, breadth 65 mm) and a mesh 43 (length 35 mm, breadth 65 mm, thickness approximately 0.2 mm) which was formed by copper wire were provided above the anode activator layer sheet corresponding to the anode activator layer 33.

A metal plate 44 (thickness approximately 1 mm, length 50 mm, breadth 80 mm) of stainless steel was pressed down onto this structure above the rubber packing 41, thereby providing a lid over the elements within the rubber packing. This metal plate 44 corresponded to the second substrate 34 of FIG. 4.

Figure 6:
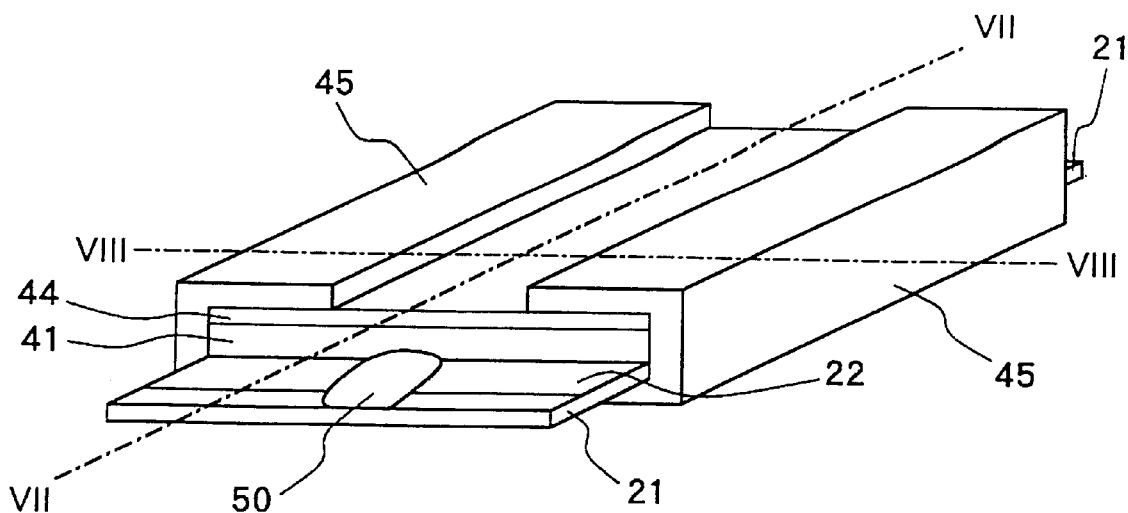
FIG. 6 is a perspective view of the light-emitting device of a first example.
Figure 7:
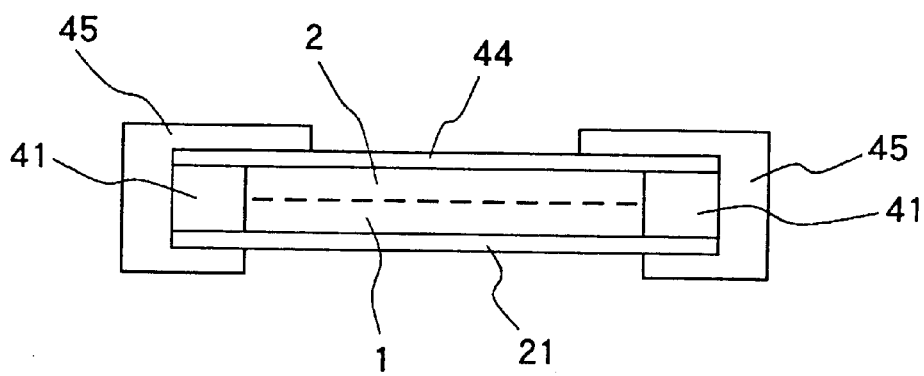
FIG. 7 is a cross-sectional view taken on line VII—VII of FIG. 6.
Figure 8:
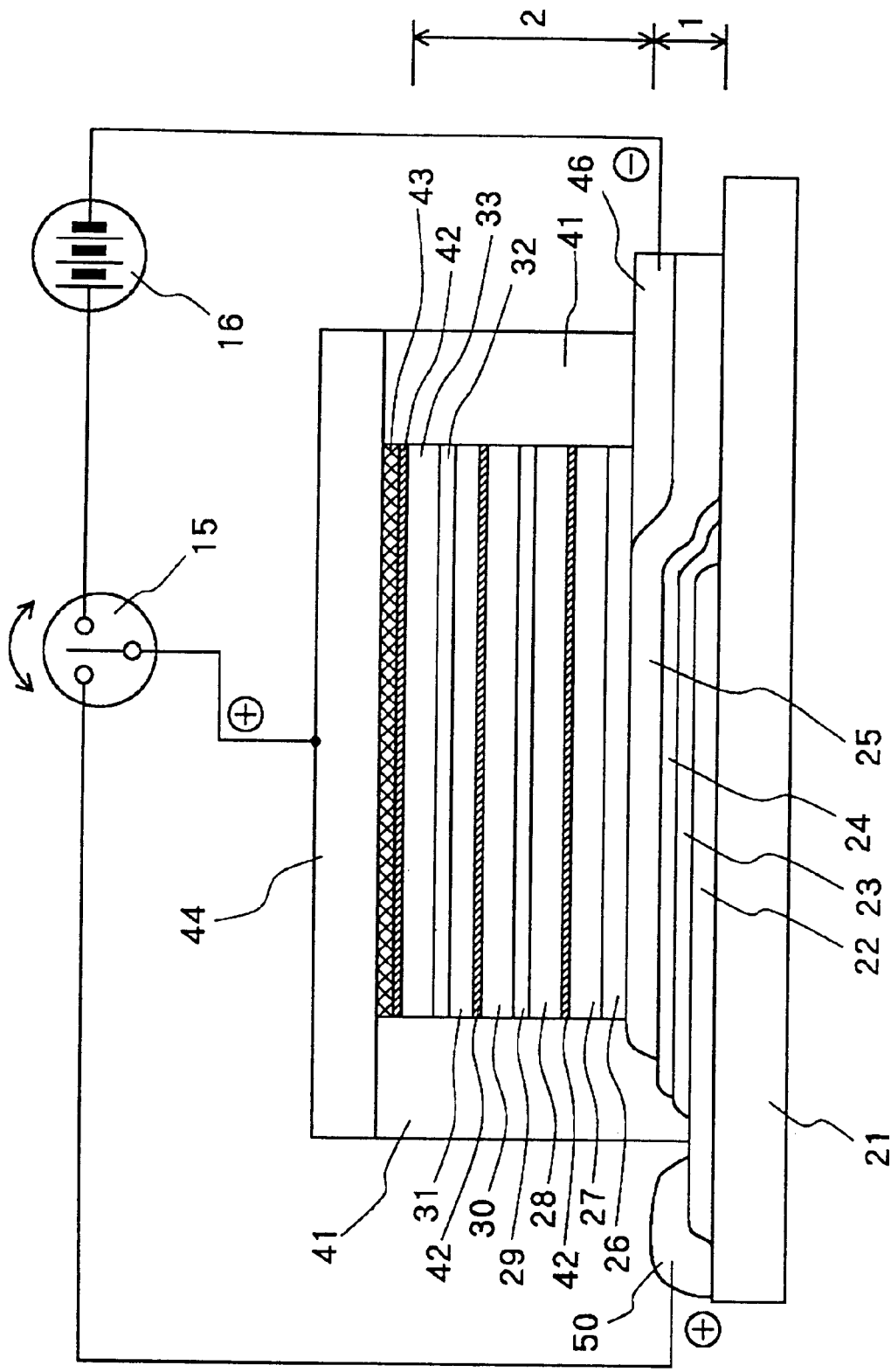
FIG. 8 is a cross-sectional view taken on line VII—VII of FIG. 6.

In this state, the transparent insulator substrate 21 formed by a glass plate, was inserted between two C-shaped resin molded bodies which were provided at each side thereof. A pressing force was thereby applied to the underside of the transparent insulator substrate 21 and the upper surface of the metal plate 44, tightening and sealing the elements. FIG. 6 shows a perspective view of the light-emitting device formed in this way; FIG. 7 shows a cross-sectional view taken on line VIII—VIII of FIG. 6; and FIG. 8 is a cross-sectional view taken on line VII—VII of FIG. 6. FIG. 8 illustrates in detail the multilayered configuration of the device.

As FIG. 8 shows, the transparent anode layer 22 was not provided to the whole of the glass plate, namely the transparent insulator substrate 21, but was provided on the glass substrate only to one portion thereof, so as not to cause a short circuit with the shared cathode layer 25. Furthermore, a copper foil 46 (thickness approximately 20 μm) was sandwiched between the glass substrate and the rubber packing 41 above the shared cathode layer 25, in order to create a sufficient electrical connection and to extract a cathode terminal 11 (See FIG. 4) to the exterior. Silver paste 50 was applied above the transparent anode layer 22 provided on the glass substrate as a second anode terminal 13 (See FIG. 4).

Inside a glove box in an atmosphere of Ar gas, the light-emitting device having the above configuration was then evaluated as follows. First, using the stainless metal plate 44 as the first anode terminal 12 and using the copper foil 46 as the cathode terminal 11, the properties of the battery portion 2 therebetween were evaluated. Next, the first anode terminal 12 comprising the stainless metal plate 14 was connected to the second anode terminal 13 comprising the silver paste 50, and electrical power was supplied to the organic EL element portion 1. The emission properties of the organic EL element portion 1 were then evaluated.

Light-emitting devices were constructed according to the above sequence using cathode activators, electrolytes and anode activators comprising various materials. The electromotive power of the battery portion 2, which comprises three unit cells stacked in parallel, and the intensity of light emitted in the organic EL element portion 1 by that electromotive force were measured. The results are shown in Table 1. In the example shown in Table 1, a wet electrolyte, wherein a solution of electrolyte to an unaqueous solvent had been sufficiently impregnated into an unwoven cloth (thickness: approximately 20 μm) comprising a polypropylene fabric, was used as the electrolytic layer. The anode activator layer comprised an inorganic compound or an organic polymer provided above an aluminium foil (thickness: 20 μm). When an inorganic compound was used as the anode activator layer, the granules of the inorganic compound were sheeted using polyvinylidene fluoride as a binder; when an organic polymer was used as the anode activator layer, the organic polymer was formed as a sheet directly onto the aluminium foil. Furthermore, in addition to the above-mentioned Li-Al alloy, the simple metals or alloys shown in the Table were used as cathode activators.

The polymer solid electrolytic film used as an electrolyte in Table 1 was formed by mixing a solution of lithium perchlorate (LiClO$_4$) into a solution of polyethylene oxide and stirring, and then sufficiently removing the solvent by means of casting. The thickness of the film was approximately 100 μm. Ion conductivity varied within a range of approximately $10^{-5}$ to $10^{-3}$ S/cm according to manufacture, but in the present embodiment, a polymer solid electrolyte having a relatively high conductivity of roughly $10^{-4}$ S/cm was used.

TABLE 1

| No. | Cathode Activator | Electrolyte | Anode Activator | Electromotive Force (V) | Light Intensity (cd/m$^2$) |
|---|---|---|---|---|---|
| 1 | Li—Al Alloy | LiPF$_6$ | MnO$_2$ | 8–11 | 150 |
| 2 | Li—Al Alloy | LiPF$_6$ | V$_2$O$_5$ | 8–11 | 150 |
| 3 | Li—Al Alloy | LiAsF$_6$ | TiS$_2$ | 5–8 | 130 |
| 4 | Li—Al Alloy | LiAsF$_6$ | MoS$_2$ | 5–7 | 120 |
| 5 | Li—Al Alloy | LiClO$_4$ | NbSe$_3$ | 5–7 | 120 |
| 6 | Li—Al Alloy | LiClO$_4$ | polyaniline | 8–11 | 150 |
| 7 | Li—Al Alloy | LiClO$_4$ | polypyrrole | 8–11 | 150 |
| 8 | Li—Al Alloy | LiBF$_4$ | poly-2,5-thienylene | 7–10 | 130 |
| 9 | Li—Al Alloy | polymer solid electrolyte | V$_2$O$_5$ | 8–11 | 20 |
| 10 | Zn—Mg Alloy | ZnI$_2$ | polyaniline | 4–5 | 80 |
| 11 | Li—Ca Alloy | LiClO$_4$ | polyaniline | 8–11 | 150 |
| 12 | Li—In Alloy | LiClO$_4$ | MnO$_2$ | 8–11 | 150 |
| 13 | Li—Sm Alloy | LiClO$_4$ | V$_2$O$_5$ | 8–11 | 150 |

As Table 1 shows, the battery portion 2 generated approximately three times the electromotive force as that of the unit cells, and the organic EL element portion 1 emitted light of an intensity corresponding to that electromotive force, demonstrating the effectiveness of the configuration and operation of the present invention. It is also possible to recharge the battery portion 2 by connecting the recharger 16 between the shared cathode layer 25 which constitutes the cathode shared by the battery portion 2 and the organic EL element portion 1, and the anode activator layer 33 of the third cell 5, which is provided as the outermost layer of the battery portion 2. Consequently, when the battery portion 2 has been exhausted, the function of the secondary battery portion 2 can be immediately restored by means of the recharger 16, enabling the organic EL element portion 1 to carry out emission of light over a long period of time. Furthermore, the organic EL element portion 1 can produce light irrespective of whether it is daytime or night-time. Moreover, since the battery portion 2 and the organic EL element portion 1 are provided in a single unit manner, the light-emitting device was noticeably more small-scale and light-weight than when provided separately as in a conventional device.

Since the present embodiment does not require lead wires and connectors to connect the battery portion 2 to the organic EL element portion 1, no electrical resistance or wasteful power exhaustion occurs therebetween. In addition, since there is no danger of disconnection due to broken wires and the like, the device has high reliability, and is less expensive due to the reduction in assembling costs.

Example 2

Figure 9:
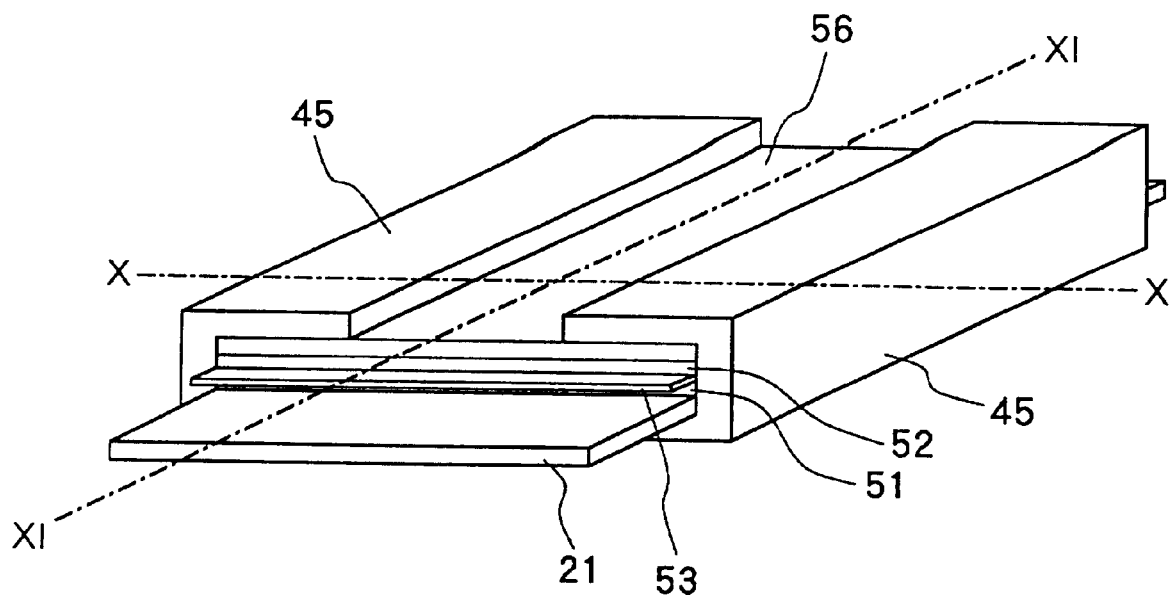
FIG. 9 is a perspective view of the light-emitting device of a second example.
Figure 10:
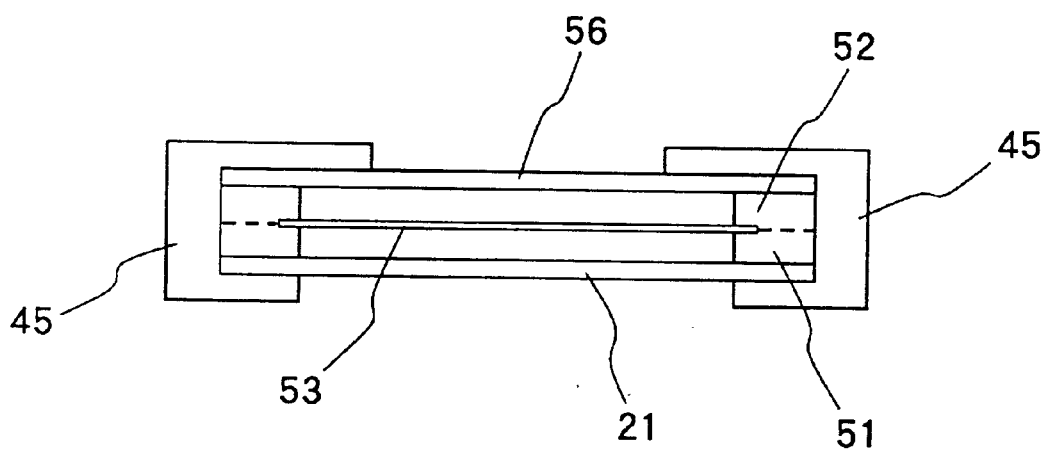
FIG. 10 is a cross-sectional view taken on line X—X of FIG. 9.
Figure 11:
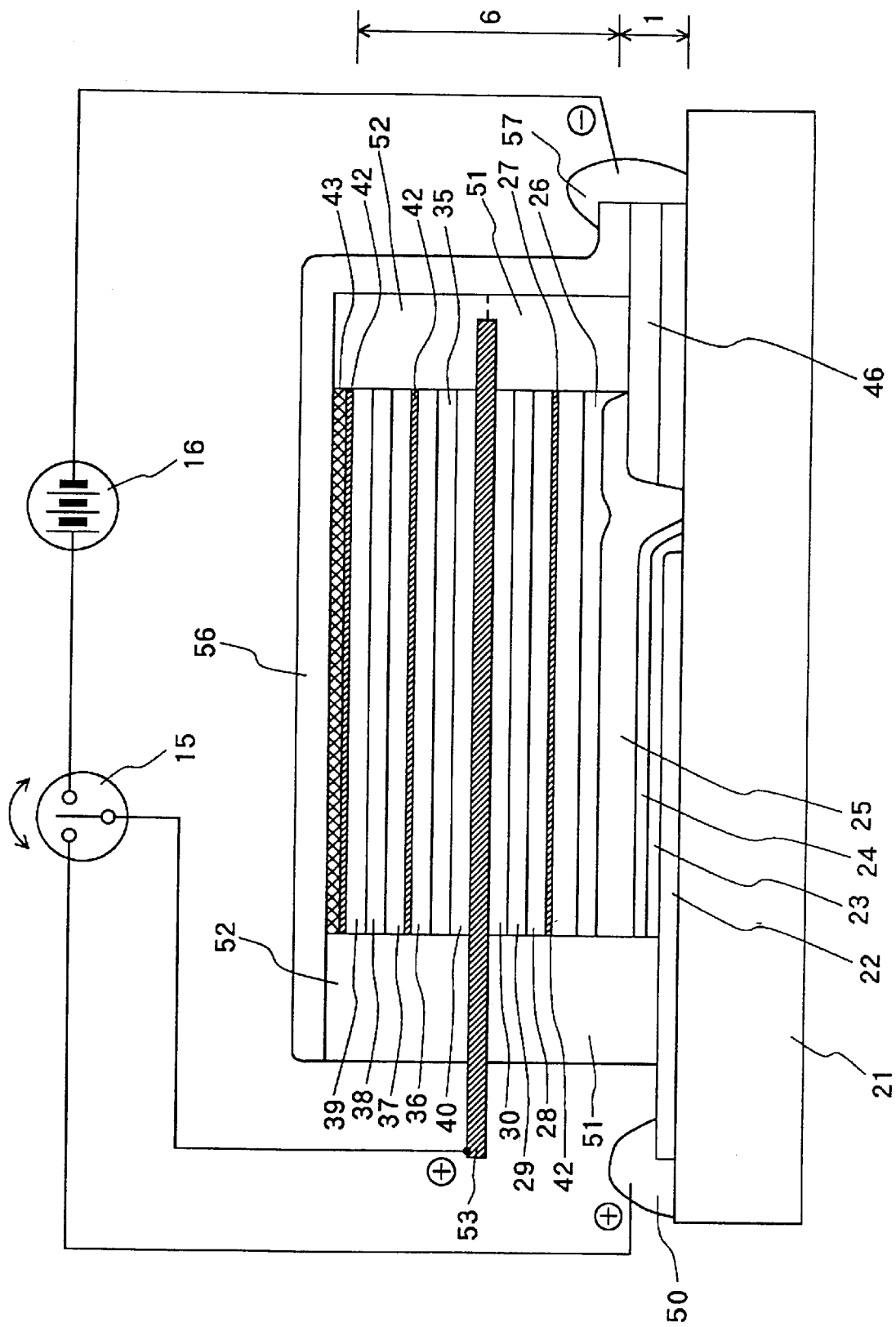
FIG. 11 is a cross-sectional view taken on line XI—XI of FIG. 9.

A light-emitting device configured so as to increase the current supplied to the organic EL element portion 1, namely the second embodiment shown in FIG. 5, was constructed. The elements of the configuration were formed in broadly the same way as in Example 1. Example 2 differs in that the stacked configuration of the battery portion 6 is electrically connected in parallel to provide an anode activator layer shared by the second cell 4 and the third cell 7. FIG. 9 shows a perspective view of the light-emitting device formed in the second example; FIG. 10 shows a cross-sectional view taken on line X—X of FIG. 9; and FIG. 11 shows a cross-sectional view taken on line XI—XI of FIG. 9. FIG. 11 illustrates the configuration of the device in detail.

The fabrication method of the device will next be explained. As in Example 1, a glass substrate was used as the transparent insulator substrate 21. Then, an ITO film constituting the transparent anode layer 22, an αNPD film constituting the hole injection/carrying layer 23, a film comprising a mixture of Alq$_3$ and Qd, and a shared cathode layer 25 shared by the organic EL element portion 1 and the secondary battery portion 6 were formed on the glass substrate by means of vacuum evaporation with the same composition, same film thickness and by the same method as Example 1. A metal mask was used during the patterning.

This glass substrate, upon which layers had been formed up to the shared cathode layer 25, was placed inside a globe box in an atmosphere of Ar gas, and a hollow-body rectangular rubber packing 51 (thickness: 0.4 mm) was provided thereto. As in Example 1, the electrolytic layer 26, the anode activator layer 27 and the copper foil 42, which constitute the first cell 3 of the battery portion 6, were multilayered in sequence within the hollow-body of the rubber packing 51. Next, the cathode activator layer 28, the electrolytic layer 29 and the anode activator layer 30, which constituted the second cell 4 of the battery portion 6 were also multilayered in sequence.

At this point of the multilayering process, a copper foil 53 (length 45 mm, breadth 90 mm, thickness approximately 30 μm) was provided so as to protrude for not less than approximately 10 mm from one end of the top of the rubber packing 51. Another rubber packing 52, having the same shape as the rubber packing 51 was placed above this copper foil 53. Next, the anode activator layer 40, the electrolytic layer 35 and the cathode activator layer 36 which constituted the third cell 7 of the battery portion 6, were multilayered in sequence within the hollow portion of this rubber packing 52 by the same multilayering method as used in Example 1, and a copper foil 42 (thickness: approximately 20 μm) was provided thereabove. Next, the anode activator layer 37, the electrolytic layer 38 and the cathode activator layer 39, which constitute the fourth cell 8, were multilayered in sequence thereabove. Here, the anode activator layer 30 of the second cell 4 and the anode activator layer 40 of the third cell 7 are separately multilayered due to the arrangement of the copper foil 53 which extracts the first anode terminal 12, but functionally, the two anode activator layers are in a single unit manner. These two anode activator layers can be structurally arranged in a single unit by modifying the structure by which the first anode terminal 12 is extracted. In the following explanation, the two anode activator layers are referred to as anode activator layer (shared anode layer) 30.

A copper foil 42 and a rectangular mesh 43 (length 35 mm, breadth 65 mm, thickness 0.2 mm) formed by aluminium wire were placed above the anode activator layer 39 of the fourth cell 8. Finally, a stainless lid 56 was provided on the rubber packing 52 and the mesh 43. This lid 56 corresponded to the second substrate 34 of FIG. 5. In this state, as in Example 1, from above glass substrate and the lid 56, two C-shaped resin molded bodies 45 were provided on the left and right sides of the elements, whereby a pressing force was applied and the internal elements were sealed.

This light-emitting device had three terminals extracted out to the exterior. The copper foil 53 extracted from the anode activator layer 30 was used as the first anode terminal 12 (See FIG. 5). The silver paste 50, which was applied to the transparent anode layer 22 of the organic EL element portion 1 formed above the glass substrate (transparent insulator substrate 21), was used as the second anode terminal 13 (See FIG. 5). Finally, the first cathode terminal 11 and the second cathode terminal 14 (See FIG. 5 for each) were internally connected. More concretely, the shared cathode layer 25 and the stainless lid 56 were electrically connected to a sufficient degree by the application of a silver paste 57, which functioned jointly as the first cathode terminal 11 and the second cathode terminal 14.

Firstly, when the first anode terminal 12 extracted by means of the copper foil 53 and the shared cathode terminal extracted by the silver paste 57 were connected to an electrometer and the electromotive force and output current of the battery were measured, the electromotive force was found to be twice that of the unit cell, and the current value was twice that of the unit cell. Next, the anode terminal provided by the copper foil 53 (first anode terminal 12) was electrically connected to the anode terminal provided by the silver paste 50 (second anode terminal 13) and the light-emitting properties of the organic EL element portion 1 were measured. Light intensity varied according to differences in electromotive force dependent upon the type of battery used, but the results obtained demonstrated that light was emitted in each case. In particular, when using solid electrolytes which generate low current values in the unit cell configuration, the light intensity increased in proportion to the resultant twofold increase in current.

Table 2 shows the electromotive forces and light intensities obtained when light-emitting devices were constructed according to the above method using cathode activators, electrolytes and anode activators comprising various materials. All the cathode activators, electrolytes and anode activators used in the Example 2 were created by the same manner as explained in Example 1.

TABLE 2

| No. | Cathode Activator | Electrolyte | Anode Activator | Electromotive Force (V) | Light Intensity (cd/m$^2$) |
|---|---|---|---|---|---|
| 1 | Li—Al Alloy | polymer solid electrolyte | $V_2O_5$ | 5.6–7.2 | 40 |
| 2 | Li—Al Alloy | polymer solid electrolyte | polyaniline | 5.4–7.4 | 40 |
| 3 | Li—Al Alloy | polymer solid electrolyte | polypyrrole | 5.4–6.4 | 40 |
| 4 | Li—Al Alloy | $LiClO_4$ | $MnO_2$ | 5.6–7.0 | 300 |

TABLE 2-continued

| No. | Cathode Activator | Electrolyte | Anode Activator | Electromotive Force (V) | Light Intensity (cd/m$^2$) |
|---|---|---|---|---|---|
| 5 | Li—Mg Alloy | $LiClO_4$ | $V_2O_5$ | 6–7 | 300 |
| 6 | Li—Mg Alloy | $LiClO_4$ | $MnO_2$ | 5.6–7.0 | 300 |
| 7 | Na—Ag Alloy | $NaClO_4$ | $MnO_2$ | 4–5 | 220 |
| 8 | K—Y Alloy | $KPF_4$ | $V_2O_5$ | 5–6 | 280 |
| 9 | Li—Sc Alloy | $LiBF_4$ | $V_2O_5$ | 5.6–7.0 | 300 |
| 10 | Pb | $H_2SO_4$ | $PbO_2$ | 4.0 | 200 |

According to the present invention described above, by providing a shared cathode layer which functions as a cathode for electron emission in an organic EL element and as at least one cathode activator layer of a battery, the device can be produced more small-scale and light-weight than conventional light-emitting devices in which the light-emitting portion and the power source are provided separately. Furthermore, since there is no electrical resistance caused by wire and connectors between the power source and the light-emitting portion, loss of power is minimal. Since few extra materials or components are required, material and assembling costs can be reduced.

Moreover, in comparison with a conventional light-emitting device in which a light-emitting body using an inorganic EL element is joined in a single unit with a solar cell, the light-emitting device of the present invention not does require the battery to be provided separately, nor is there a need for a boosting/oscillating portion. Therefore, noticeable small-scaling, light-weighting and cost reduction can be achieved, and the device can emit light over long periods even in places where there is no daytime sunlight.

According to the present invention, by altering the stacked configuration in the battery portion and thereby altering the current and voltage values, it is possible to supply an appropriate voltage and current even when light-emitting capability varies according to the light-emitting elements, thereby obtaining good light-emitting capability. Furthermore, since a recharger can be easily appended, the present invention contributes to extending the longevity of the batteries and consequently the longevity of the light-emitting device itself.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A light-emitting device comprising:
    an organic electroluminescent light-emitting element;
    a battery for supplying stored electrical power directly to the organic electroluminescent light-emitting element; and
    a shared cathode layer forming both a cathode layer of the organic electroluminescent light-emitting element and at least one cathode activator layer of the battery; wherein
    the organic electroluminescent light-emitting element, the battery, and the shared cathode layer form a single body.

2. A light-emitting device according to claim 1, wherein the organic electroluminescent light-emitting element is provided on a bottom surface of the shared cathode layer, the battery is provided on a top surface of the shared cathode layer, and the organic electroluminescent light-emitting element and the battery are multilayered using the shared cathode layer.

3. A light-emitting device according to claim 1, wherein the shared cathode layer comprises a metal having a work function of no greater than 4.3 eV.

4. A light-emitting device according to claim 1, wherein the shared cathode layer comprises one or more metals selected from a group consisting of alkali metals, alkaline earth metals, aluminum, zinc, silver, lead, scandium, indium, samarium, and yttrium, or alloy containing at least one of the above metals, or a compound containing at least one of the above metals.

5. A light-emitting device according to claim 1, wherein said battery is rechargeable.

6. A light-emitting device comprising:
an organic electroluminescent light-emitting element;
a lithium battery; and
a shared cathode layer forming both a cathode layer of the organic electroluminescent light-emitting element and at least one cathode activator layer of the battery; wherein
the organic electroluminescent light-emitting element, the battery, and the shared cathode layer form a single body.

7. A light-emitting device comprising:
an organic electroluminescent light-emitting element that comprises a transparent anode layer;
a battery that comprises a plurality of unit cells in a multilayered arrangement; and
a shared cathode layer forming both a cathode layer of the organic electroluminescent light-emitting element and at least one cathode activator layer of the battery;
wherein the organic electroluminescent light-emitting element, the battery, and the shared cathode layer form a single body; and
wherein light is emitted by electrically connecting a first anode terminal, extracted from an anode activator layer of an uppermost one of the unit cells, to a second anode terminal, extracted from the transparent anode layer.

8. A light-emitting device according to claim 7, further comprising a switch that, in a first position, connects the first anode terminal to the second anode terminal, and that, in a second position, connects a positive electrode of an external power source to the first anode terminal, wherein a negative electrode of the external power source is electrically connected to the shared cathode layer.

9. A light-emitting device comprising:
an organic electroluminescent light-emitting element that comprises a transparent anode layer;
a battery that comprises at least two unit cells, less than all of the unit cells being multilayered to form a first stack and the remaining unit cells being multilayered to form a second stack, an anode activator within each of the first and second stacks together constituting a shared anode layer; and
a shared cathode layer forming both a cathode layer of the organic electroluminescent light-emitting element and at least one cathode activator layer of the battery;
wherein a cathode activator within the first stack is the shared cathode layer, which is electrically connected to a cathode activator layer within the second stack;
and wherein light is emitted by electrically connecting the shared anode layer to the transparent anode layer;
and wherein the organic electroluminescent light-emitting element, the battery, and the shared cathode layer form a single body.

10. A light-emitting device according to claim 9, further comprising a switch that, in a first position, connects the shared anode layer to the transparent anode layer, and that, in a second position, connects a positive electrode of an external power source to the shared anode layer, wherein a negative electrode of the external power source is electrically connected to the shared cathode layer.

11. A light-emitting device according to claim 9, wherein the first stack is disposed on one side of the shared anode layer, and wherein the second stack is disposed on another side of the shared anode layer, and wherein the first stack and the second stack are provided in a multilayered arrangement using the shared anode layer.

12. A light-emitting device comprising:
an organic electroluminescent light-emitting element;
a battery that constitutes the sole power source for the organic electroluminescent light-emitting element; and
a shared cathode layer forming both a cathode layer of the organic electroluminescent light-emitting element and at least one cathode activator layer of the battery;
wherein the organic electroluminescent light-emitting element, the battery, and the shared cathode layer form a single body.

* * * * *

UNITED STATES PATENT AND TRADEMARK OFFICE
CERTIFICATE OF CORRECTION

PATENT NO. : 6,028,327
DATED : February 22, 2000
INVENTOR(S) : Katsuhiro Mizoguchi and Taizou Tanaka It is certified that error appears in the above-identified patent and that said Letters Patent is hereby corrected as shown below:

Column 6,
Line 33, delete "VII - VII" and insert therefor -- VIII - VIII --.

Column 10,
Line 21, delete "4" and insert therefor -- 7 --.

Signed and Sealed this

Twenty-eighth Day of August, 2001

Attest:

*Nicholas P. Godici*

NICHOLAS P. GODICI
*Attesting Officer*     *Acting Director of the United States Patent and Trademark Office*